(12) United States Patent
Lius et al.

(10) Patent No.: US 10,784,327 B2
(45) Date of Patent: Sep. 22, 2020

(54) DISPLAY DEVICE

(71) Applicant: INNOLUX CORPORATION, Miao-Li County (TW)

(72) Inventors: Chandra Lius, Miao-Li County (TW); Kuan-Feng Lee, Miao-Li County (TW); Nai-Fang Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/136,860

(22) Filed: Sep. 20, 2018

(65) Prior Publication Data
US 2019/0019853 A1   Jan. 17, 2019

Related U.S. Application Data

(63) Continuation of application No. 15/441,329, filed on Feb. 24, 2017, now Pat. No. 10,141,387.

(60) Provisional application No. 62/382,281, filed on Sep. 1, 2016, provisional application No. 62/337,384, filed on
(Continued)

(51) Int. Cl.
*H01L 29/66* (2006.01)
*H01L 27/32* (2006.01)
*H01L 27/12* (2006.01)
*H01L 29/786* (2006.01)

(52) U.S. Cl.
CPC ...... *H01L 27/3262* (2013.01); *H01L 27/1214* (2013.01); *H01L 27/1225* (2013.01); *H01L 27/1251* (2013.01); *H01L 27/1255* (2013.01); *H01L 27/3248* (2013.01); *H01L 27/3272* (2013.01); *H01L 29/78645* (2013.01); *H01L 29/78648* (2013.01); *H01L 29/7869* (2013.01);
(Continued)

(58) Field of Classification Search
None
See application file for complete search history.

(56) References Cited

U.S. PATENT DOCUMENTS 6,777,254 B1 * 8/2004 Yamazaki ........... H01L 21/0273
                                                    438/30
2008/0018566 A1   1/2008 Yamauchi et al.
(Continued)

FOREIGN PATENT DOCUMENTS

CN        10 3295962 A      9/2013
CN        105321957 A       2/2016

*Primary Examiner* — Ali Naraghi
(74) *Attorney, Agent, or Firm* — Bacon & Thomas, PLLC

(57) ABSTRACT

A display device is disclosed, which includes: a substrate; a light emitting diode disposed above the substrate; a first transistor disposed above the substrate; and a second transistor disposed above the substrate. The first transistor includes: a first semiconductor layer; a first top gate electrode disposed above the first semiconductor layer; a first bottom gate electrode disposed under the first semiconductor layer; a first source electrode electrically connected to the first semiconductor layer; and a first drain electrode electrically connected to the first semiconductor layer, wherein the first drain electrode is electrically connected to the light emitting diode. In addition, the second transistor includes: a second semiconductor layer. Herein, one of the first semiconductor layer and the second semiconductor layer includes a first silicon semiconductor layer, and the other includes a first oxide semiconductor layer.

13 Claims, 15 Drawing Sheets

Related U.S. Application Data on May 17, 2016, provisional application No. 62/319,965, filed on Apr. 8, 2016.

(52) U.S. Cl.
CPC .. *H01L 29/78672* (2013.01); *H01L 29/78696* (2013.01)

(56) References Cited

U.S. PATENT DOCUMENTS

| | | | | |
|---|---|---|---|---|
| 2010/0182223 | A1* | 7/2010 | Choi | G09G 3/3233 345/76 |
| 2013/0288426 | A1* | 10/2013 | Akimoto | H01L 27/127 438/104 |
| 2015/0171115 | A1* | 6/2015 | Yamazaki | H01L 27/115 257/43 |

* cited by examiner

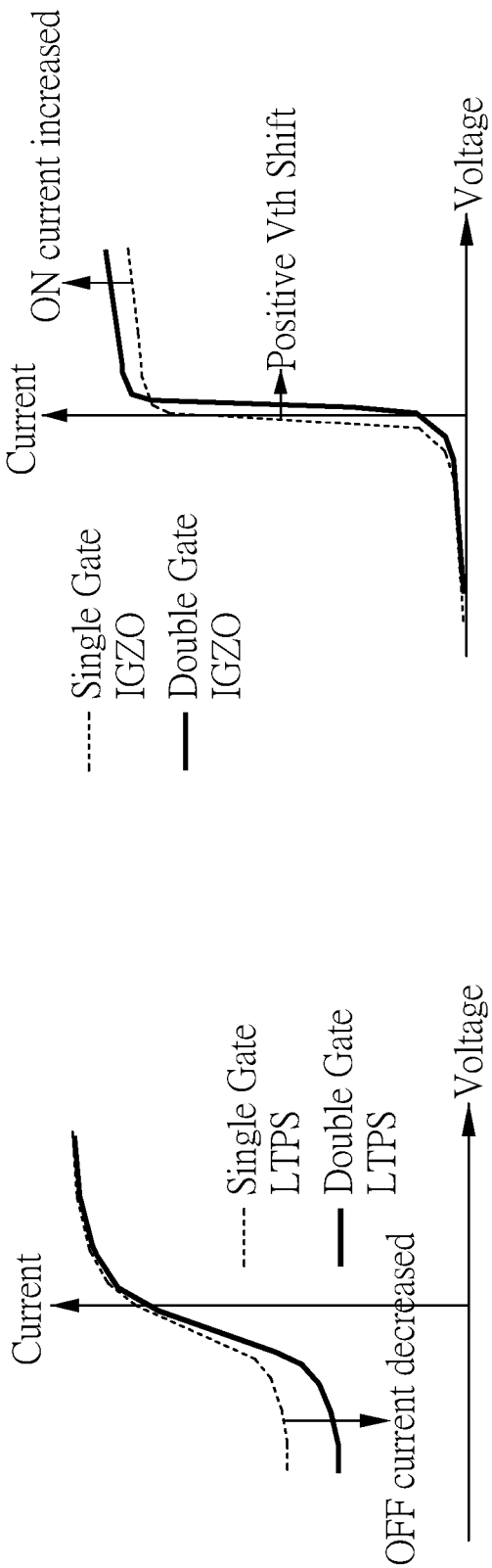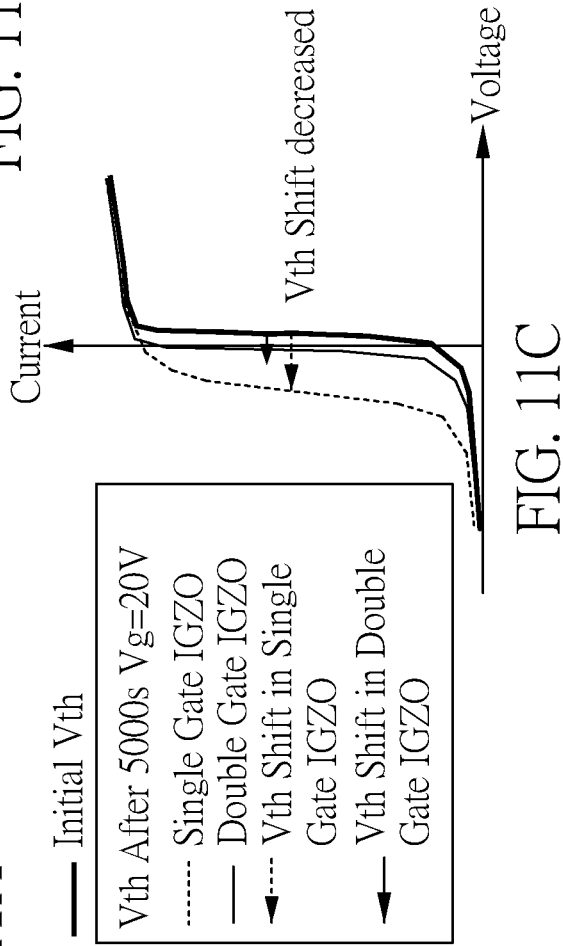
FIG. 11A
FIG. 11B
FIG. 11C

DISPLAY DEVICE

CROSS REFERENCE TO RELATED APPLICATION

This application claims the benefit of filing date of U.S. Provisional Application Ser. Nos. 62/319,965, 62/337,384 and 62/382,281, respectively filed Apr. 8, May 17, and Sep. 1, 2016 under 35 USC § 119(e)(1).

This application is a continuation application of U.S. Patent application for "Display Device", U.S. application Ser. No. 15/441,329 filed Feb. 24, 2017, the subject matter of which is incorporated herein by reference.

BACKGROUND

1. Field

The present disclosure relates to display devices, and more particularly to a display device comprising both a low-temperature polycrystalline silicon (LTPS) thin film transistor and an oxide thin film transistor.

2. Description of Related Art

With the continuous advancement of technologies related to displays, all the display panels are now developed toward compactness, thinness, and lightness. This trend makes thin displays, such as liquid crystal display panels, organic light-emitting diode display panels and inorganic light-emitting diode display panels, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

While liquid crystal display devices and organic light-emitting diode display devices are popular on the market, in which LCD display devices particularly enjoy technical maturity, manufacturers pay even more effort to improve display devices in terms of display quality thereby answering to ongoing technical development of display devices and consumers' increasing demands.

The thin film transistor (TFT) structure can be polycrystalline silicon thin film transistors (TFT) featuring high carrier mobility, or metal oxide thin film transistors (TFT) featuring low leakage. There are presently no displays combining these two types of transistors because the manufacturing processes for making the two are not quite compatible, making the overall manufacturing of such display devices complicated (such as by requiring more times of chemical vapor deposition). Moreover, in a single pixel unit of the organic light-emitting diode display device, there are at least three thin film transistor (TFT) units, so the light-emitting area is limited and production of the thin film transistor (TFT) substrate is complicated.

In view of this, a need exists for an improved and simplified process for manufacturing a thin film transistor (TFT) substrate that has both a polycrystalline silicon thin film transistor (TFT) and a metal oxide thin film transistor (TFT).

SUMMARY

The object of the present disclosure is to provide a display device, which has both a LTPS thin film transistor and an oxide thin film transistor at the same time.

The display device of the present disclosure comprises: a substrate; a light emitting diode disposed above the substrate; a first transistor disposed above the substrate; and a second transistor disposed above the substrate. The first transistor comprises: a first semiconductor layer; a first top gate electrode disposed above the first semiconductor layer; a first bottom gate electrode disposed under the first semiconductor layer; a first source electrode electrically connected to the first semiconductor layer; and a first drain electrode electrically connected to the first semiconductor layer, wherein the first drain electrode is electrically connected to the light emitting diode. In addition, the second transistor comprises: a second semiconductor layer. Herein, one of the first semiconductor layer and the second semiconductor layer comprises a first silicon semiconductor layer, and the other comprises a first oxide semiconductor layer.

In the display device of the present disclosure, the first transistor is served as a driving TFT. The first transistor has a double gate structure comprising the first top gate electrode and the first bottom electrode, and the first top gate electrode and the first bottom electrode are respectively disposed at two sides of the first semiconductor layer. When the first transistor has the aforesaid double gate structure, ON current or electron charging speed of the first transistor can be improved. In addition, the first bottom gate electrode can also function as a light shielding means, to prevent light-induced current leakage or light-induced instability of the first transistor.

Other objects, advantages, and novel features of the present disclosure will become more apparent from the following detailed description when taken in conjunction with the accompanying drawings.

BRIEF DESCRIPTION OF THE DRAWINGS

FIG. 11A is a schematic voltage vs. current diagram showing the OFF current shift between a single gate LTPS TFT and a double gate LTPS TFT.

FIG. 11B is a schematic voltage vs. current diagram showing the ON current shift and the Vth shift between a single gate IGZO TFT and a double gate IGZO TFT.

FIG. 11C is a schematic voltage vs. current diagram showing the Vth shift between a single gate IGZO TFT and a double gate IGZO TFT after 5000 sec operation.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

In the following embodiments, the term "single gate" refers to a thin film transistor with only one gate electrode. The term "double gate" refers to a thin film transistor with two gate electrodes respectively disposed at two sides of a semiconductor layer. The term "dual gate" refers to a thin film transistor with two gate electrodes simultaneously disposed at one side of a semiconductor layer. In addition, the term "double gate LTPS/IGZO TFT" refers to the LTPS/IGZO with the double gate structure. The term "dual gate LTPS/IGZO TFT" refers to the LTPS/IGZO with the dual gate structure. The term "single gate LTPS/IGZO TFT" refers to the LTPS/IGSO with the single gate structure.

Embodiment 1

Figure 1:
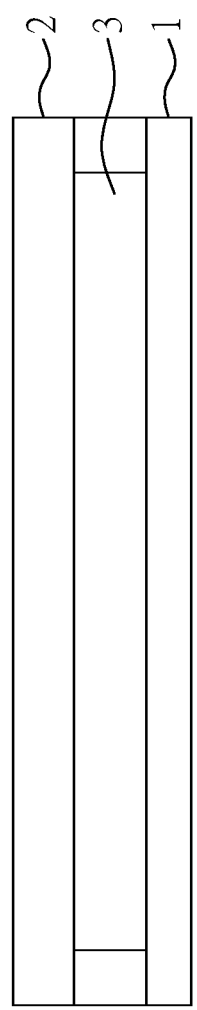
FIG. 1 is a schematic cross sectional view of a display device according Embodiment 1 of the present disclosure.

FIG. 1 is a schematic cross sectional view a display device of the present embodiment. Therein, the display device comprises: a first substrate 1; a second substrate 2 opposite to the first substrate 1; and a display medium layer 3 arranged between the first substrate 1 and the second substrate 2. In the present embodiment, the first substrate 1 and the second substrate 2 may be prepared by glass, plastic, a flexible material or a thin film; but the present disclosure is not limited thereto. When the first substrate 1 and the second substrate 2 is prepared by plastic, the flexible material or the thin film, the display device can be a flexible display device. In the present embodiment, the display medium 3 may comprise a light emitting diode, for example, an inorganic light emitting diode or an organic light emitting diode; but the present disclosure is not limited thereto. In the present embodiment and the following embodiments of the present disclosure, the display medium 3 comprises an organic light emitting diode, and thus the display device is an organic light-emitting diode display device. In addition, in other embodiments of the present disclosure, the display device can be optionally made without the second substrate 2.

Figure 2:
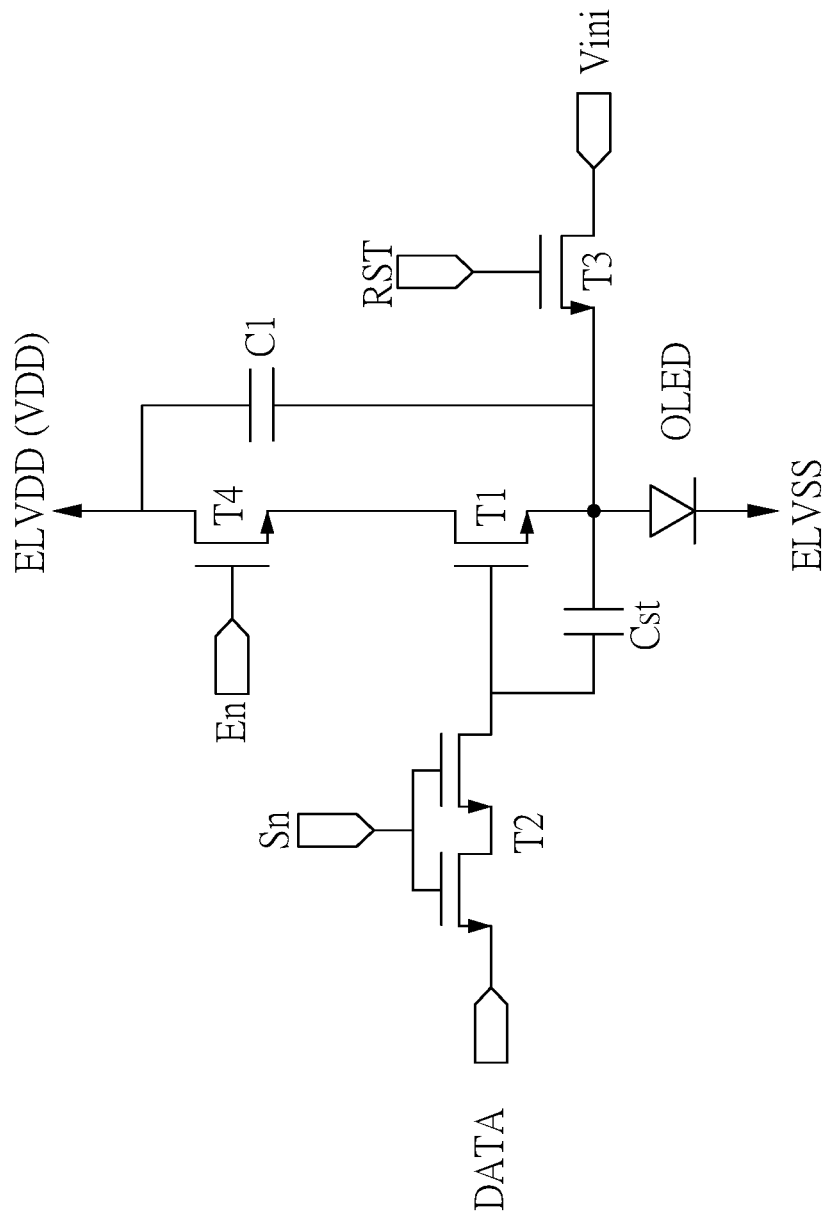
FIG. 2 is an equivalent-circuit diagram of a pixel of the display device according to Embodiment 1 of the present disclosure.

In the display device of the present embodiment, the first substrate 1 is provided with a plurality of pixel units (not shown in the figure). One of these pixel units may be designed as, for example, the equivalent-circuit diagram as shown in FIG. 2. In the equivalent-circuit diagram of FIG. 2, the pixel comprises: a driving thin film transistor T1; a switching thin film transistor T2, wherein a scan signal Sn and a data signal Data are transferred to the switching thin film transistor T2; a reset thin film transistor T3, wherein an initialization voltage Vini and a reset signal RST are transferred to the reset thin film transistor T3 for initializing the driving thin film transistor T1; an emitting thin film transistor T4, wherein an emission control signal En is transferred to the emitting thin film transistor T4; a first capacitor C1; and a second capacitor Cst. Hence, the equivalent-circuit diagram shown in FIG. 2 is a 4T2C circuit. In addition, a driving voltage ELVDD is transferred to an organic light emitting diode OLED; and a cathode of the organic light emitting diode OLED is connected to a common voltage ELVSS.

In the present embodiment, the driving thin film transistor T1 is a LTPS thin film transistor with a double gate structure.

Figure 3:
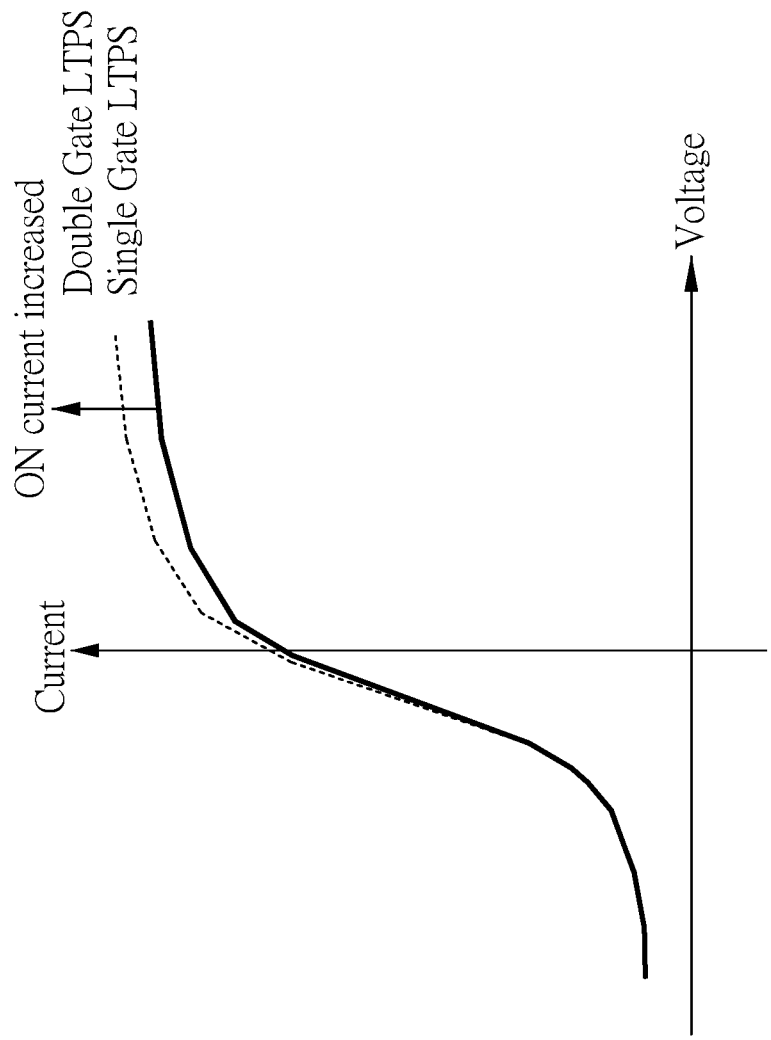
FIG. 3 is a schematic voltage vs. current diagram showing the ON current shift between a single gate LTPS TFT and a double gate LTPS TFT.

FIG. 3 is a schematic voltage vs. current diagram showing the ON current shift between a single gate LTPS TFT and a double gate LTPS TFT. As shown in FIG. 3, the ON current of the double gate LTPS TFT is larger than that of the single gate LTPS TFT. This result indicates that when the driving thin film transistor T1 is a LTPS TFT with the double gate structure, the charging ability thereof can be improved, the ON current can be increased, and a better current stability can be achieved. Furthermore, the bottom gate of the LTPS TFT can also be used as a light shielding layer.

Hereinafter, three aspects of the display devices of Embodiment 1 are exemplified, in which the driving thin film transistor T1 is a LTPS TFT with the double gate structure. However, the present disclosure is not limited thereto.

Embodiment 1-1

Figure 4:
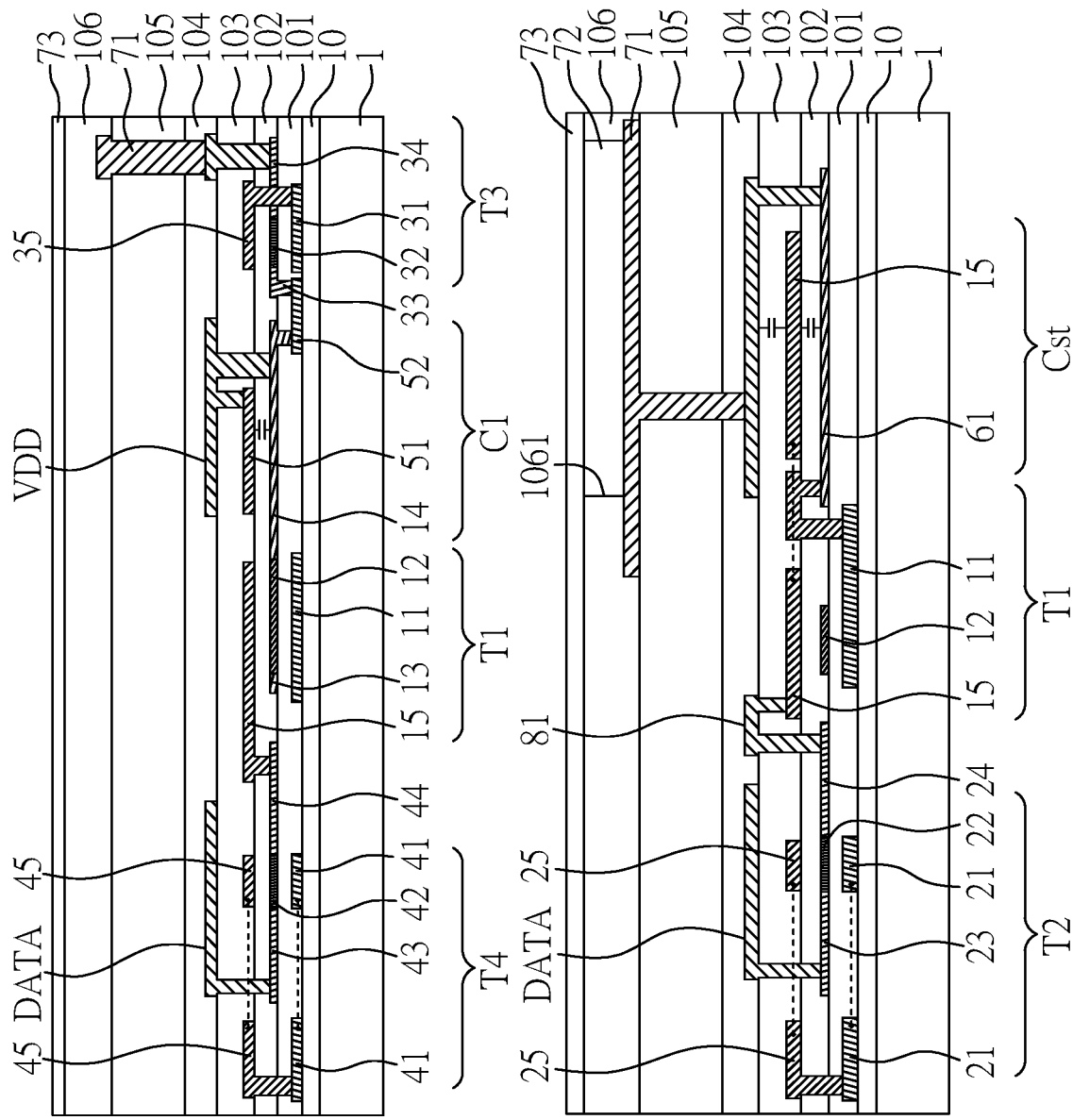
FIG. 4 is a schematic cross sectional view of the display device according to Embodiment 1-1 of the present disclosure.

FIG. 4 is a schematic cross sectional view of the display device of the present embodiment. The process for preparing the display device of the present embodiment is briefly described below.

First, a first substrate 1 is provided, and a first buffer layer 10 is formed on the first substrate 1. Next, a first metal layer comprising a first bottom gate 11, a second bottom gate 21, a third bottom gate 31 and a fourth bottom gate 41 are formed on the first buffer layer 10; wherein the dashed line between the second bottom gates 21 means the second bottom gates 21 are linked in another cross sectional view, and the dashed line between the fourth bottom gates 41 also means the fourth bottom gates 41 are linked in further another cross sectional view. Then, a second buffer layer 101 is formed on the metal layer and the first buffer layer 10.

Next, a silicon semiconductor layer and an oxide semiconductor layer are formed. Herein, the silicon semiconductor layer is a low temperature polysilicon layer, and parts of the silicon semiconductor layer are doped to adjust their electrical conductivity to form electrodes. After the doping process, a first source electrode 13, and a first drain electrode 14 are formed.

In addition, the oxide semiconductor layer is a metal oxide layer; and in regions of the oxide semiconductor layer to be formed as electrodes, the electrical conductivity of these regions can be adjusted by hydrogen diffusion from insulating layers formed on these regions. The metal oxide layer can be a zinc-oxide-based metal oxide layer, for example, IGZO, ITZO, IGTZO or the like. Hereinafter, the metal oxide layer being an IGZO layer is exemplified, but the present disclosure is not limited thereto.

After the aforesaid process, a second semiconductor layer 22, a second source electrode 23, a second drain electrode 24, a third semiconductor layer 32, a third source electrode 33, a third drain electrode 34, a fourth semiconductor layer 42, a fourth source electrode 43 and a fourth drain electrode 44 are formed.

Next, a gate insulating layer 102 is formed on the silicon semiconductor layer and the oxide semiconductor layer. A second metal layer is formed on the gate insulating layer 102; wherein the second metal layer comprises a first top gate electrode 15, a second top gate electrode 25, a third top gate electrode 35, a fourth top gate electrode 45 and a capacitor electrode 51. Similarly, the dashed lines between the first top gate electrodes 15, the second top gate electrodes 25 as well as the fourth top gate electrodes 45 means the first top gate electrodes 15, the second top gate electrodes 25 as well as the fourth top gate electrodes 45 are linked in further another cross sectional view. It should be noted that the third top gate electrode 35 is connected to the third bottom gate 31 through an additional via and are not linked with the third drain electrode 34. Meanwhile, the capacitor electrode 51 are not linked with any of the gate electrodes mentioned above, but are provided with ELVDD voltage level and are electrically coupled with the first drain electrode 14 to produce a first capacitor C1.

An insulating layer 103 is formed on the second metal layer, followed by forming a third metal layer including circuit lines DATA, VDD. A passivation layer 104 is formed on the insulating layer 103 and the third metal layer, and a planer layer 105 is formed on the passivation layer 105.

An anode 71 penetrating through the planer layer 105 and the passivation layer 104 is then formed on the planer layer 105. A pixel defining layer 106 is then formed on the anode 71 and the planer layer 105; wherein the pixel defining layer 106 has an opening 1061 to expose partial anode 71. A light emitting layer 72 which is an organic emitting layer is then formed in the opening 1061. Finally, a cathode 73 is formed on the pixel defining layer 106 and the light emitting layer 72.

Herein, the first buffer layer 10, the second buffer layer 101, the gate insulating layer 102, the insulating layer 103, the passivation layer 104 and the planer layer 105 can be prepared by silicon oxide or silicon nitride, or may be a layered structure made of silicon nitride and silicon oxide. However, the present disclosure is not limited thereto. The pixel defining layer 106 can be prepared by any resin material. The first metal layer, the second metal layer and the third metal layer can be prepared by metals (such as Cu, Al, Ti, Cr, Mo, or alloy thereof) or other electrode materials. The anode 71 can be a reflective electrode which can be prepared by Al or Ag; but the present disclosure is not limited thereto. The cathode 73 can be a transparent electrode which can be prepared by transparent conductive oxides such as ITO, IZO, ITZO and so on; but the present disclosure is not limited thereto.

After the aforementioned process, the display device of the present embodiment is obtained. The display device comprises: a substrate 1, a light emitting diode (including the anode 71, the light emitting layer 72 and the cathode 73) disposed above the substrate 1; a driving thin film transistor T1, a switching thin film transistor T2, a reset thin film transistor T3 and an emitting thin film transistor T4 disposed above the substrate 1; a first capacitor C1 disposed above the substrate 1; and a second capacitor Cst disposed above the substrate. In the present embodiment, all the driving thin film transistor T1, the switching thin film transistor T2, the reset thin film transistor T3 and the emitting thin film transistor T4 have double gate structures.

The driving thin film transistor T1 is a LTPS TFT, which comprises: a first semiconductor layer 12; a first top gate electrode 15 disposed above the first semiconductor layer 12; a first bottom gate 11 disposed under the first semiconductor layer 12; a first source electrode 13 electrically connected to the first semiconductor layer 12; a first drain electrode 14 electrically connected to the first semiconductor layer 12, wherein the first drain electrode 14 is electrically connected to the light emitting diode (including the anode 71, the light emitting layer 72 and the cathode 73). Herein, the first semiconductor layer 12, the first source electrode 13 and the first drain electrode 14 comprise a silicon semiconductor layer and are integrated. The first source electrode 13 and the first drain electrode 14 are disposed below the first top gate electrode 15.

The switching thin film transistor T2 is an IGZO TFT, which comprises: a second semiconductor layer 22; a second top gate electrode 25 disposed above the second semiconductor layer 22; a second bottom gate 21 disposed under the second semiconductor layer 22; a second source electrode 23 electrically connected to the second semiconductor layer 22; a second drain electrode 24 electrically connected to the second semiconductor layer 22. Herein, the second semiconductor layer 22, the second source electrode 23 and the second drain electrode 24 comprise an oxide semiconductor layer and are integrated. The second source electrode 23 and the second drain electrode 24 are disposed below the second top gate electrode 25. In addition, the second drain electrode 24 is electrically connected to the first top gate electrode 15 via a metal layer 81.

The reset thin film transistor T3 is an IGZO TFT, which comprises: a third semiconductor layer 32; a third top gate electrode 35 disposed above the third semiconductor layer 32; a third bottom gate 31 disposed under the third semiconductor layer 32; a third source electrode 33 electrically connected to the third semiconductor layer 32; a third drain electrode 34 electrically connected to the third semiconductor layer 32. Herein, the third semiconductor layer 32, the third source electrode 33 and the third drain electrode 34 comprise an oxide semiconductor layer and are integrated. The third source electrode 33 and the third drain electrode 34 are disposed below the third top gate electrode 35.

The emitting thin film transistor T4 is an IGZO TFT, which comprises: a fourth semiconductor layer 42; a fourth top gate electrode 45 disposed above the fourth semiconductor layer 42; a fourth bottom gate 41 disposed under the fourth semiconductor layer 42; a fourth source electrode 43 electrically connected to the fourth semiconductor layer 42; a fourth drain electrode 44 electrically connected to the fourth semiconductor layer 42. Herein, the fourth semiconductor layer 42, the fourth source electrode 43 and the fourth drain electrode 44 comprise an oxide semiconductor layer and are integrated. The fourth source electrode 43 and the fourth drain electrode 44 are disposed below the fourth top gate electrode 45. In addition, the fourth drain electrode 44 is electrically connected to the first top gate electrode 15 via direct contact.

The first capacitor C1 comprises a capacitor electrode 51. The first drain electrode 14 is extended as another capacitor electrode of the first capacitor C1, and the capacitor electrode 51 and the first drain electrode 14 partially overlap. In addition, the first capacitor C1 is also electrically connected to the reset thin film transistor T3 through a conductive line 52.

The second capacitor Cst comprises a fifth semiconductor layer 61 as a capacitor electrode, and the fifth semiconductor layer 61 includes a silicon semiconductor layer. In addition, the first top gate electrode 15 is also extended as another capacitor electrode of the second capacitor Cst, and the fifth semiconductor layer 61 and the first top gate electrode 15 partially overlap.

Embodiment 1-2

Figure 5:
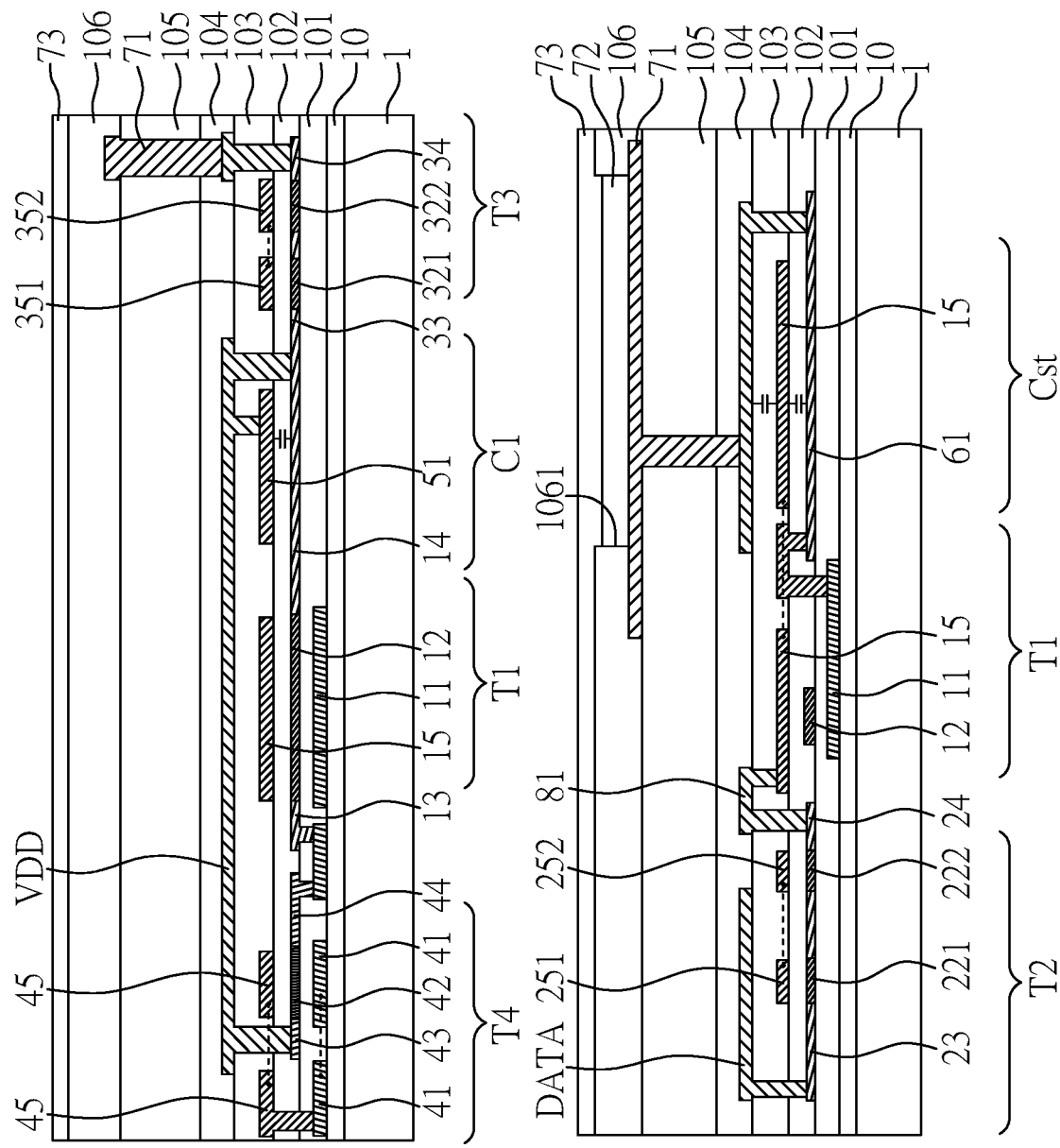
FIG. 5 is a schematic cross sectional view of the display device according to Embodiment 1-2 of the present disclosure.

FIG. 5 is a schematic cross sectional view of the display device of the present embodiment. The preparation process and the structure of the display device of the present embodiment are similar to those of Embodiment 1-1, except for the following differences.

In Embodiment 1-1, the driving thin film transistor T1 is a LTPS TFT, the switching thin film transistor T2 and the reset thin film transistor T3 are IGZO TFTs. In the present embodiment, the driving thin film transistor T1 is a LTPS TFT, the switching thin film transistor T2 and the reset thin film transistor T3 are LTPS TFTs, and the emitting thin film transistor T4 is an IGZO TFT.

The process for preparing the switching thin film transistor T2 and the reset thin film transistor T3 are similar to that for preparing the driving thin film transistor T1, except for the following differences.

When forming the semiconductor layers of the switching thin film transistor T2 and the reset thin film transistor T3, two second semiconductor regions 221, 222 and two third semiconductor regions 321, 322 are respectively defined. In addition, when forming the top gates of the switching thin film transistor T2 and the reset thin film transistor T3, two second top gate electrodes 251, 252 and two third top gate electrodes 351, 352 are respectively defined. Hence, in the present embodiment, the switching thin film transistor T2 and the reset thin film transistor T3 are respectively LTPS TFTs with dual gate structures.

The switching thin film transistor T2 is an LTPS TFT, which comprises: two second semiconductor regions 221, 222; two second top gate electrodes 251, 252 disposed above and respectively corresponding to the two second semiconductor regions 221, 222; a second source electrode 23 electrically connected to the second semiconductor region 221; and a second drain electrode 24 electrically connected to the second semiconductor region 222. Herein, the second semiconductor regions 221, 222, the second source electrode 23 and the second drain electrode 24 comprise a silicon semiconductor layer and are integrated. The second source electrode 23 and the second drain electrode 24 are disposed below the second top gate electrodes 251, 252.

The reset thin film transistor T3 is an LTPS TFT, which comprises: two third semiconductor regions 321, 322; two third top gate electrodes 351, 352 disposed above and respectively corresponding to the two third semiconductor regions 321, 322; a third source electrode 33 electrically connected to the third semiconductor region 321; and a third drain electrode 34 electrically connected to the third semiconductor region 322. Herein, the third semiconductor regions 321, 322, the third source electrode 33 and the third drain electrode 34 comprise a silicon semiconductor layer and are integrated. The third source electrode 33 and the third drain electrode 34 are disposed below the third top gate electrodes 351, 352.

Embodiment 1-3

Figure 6:
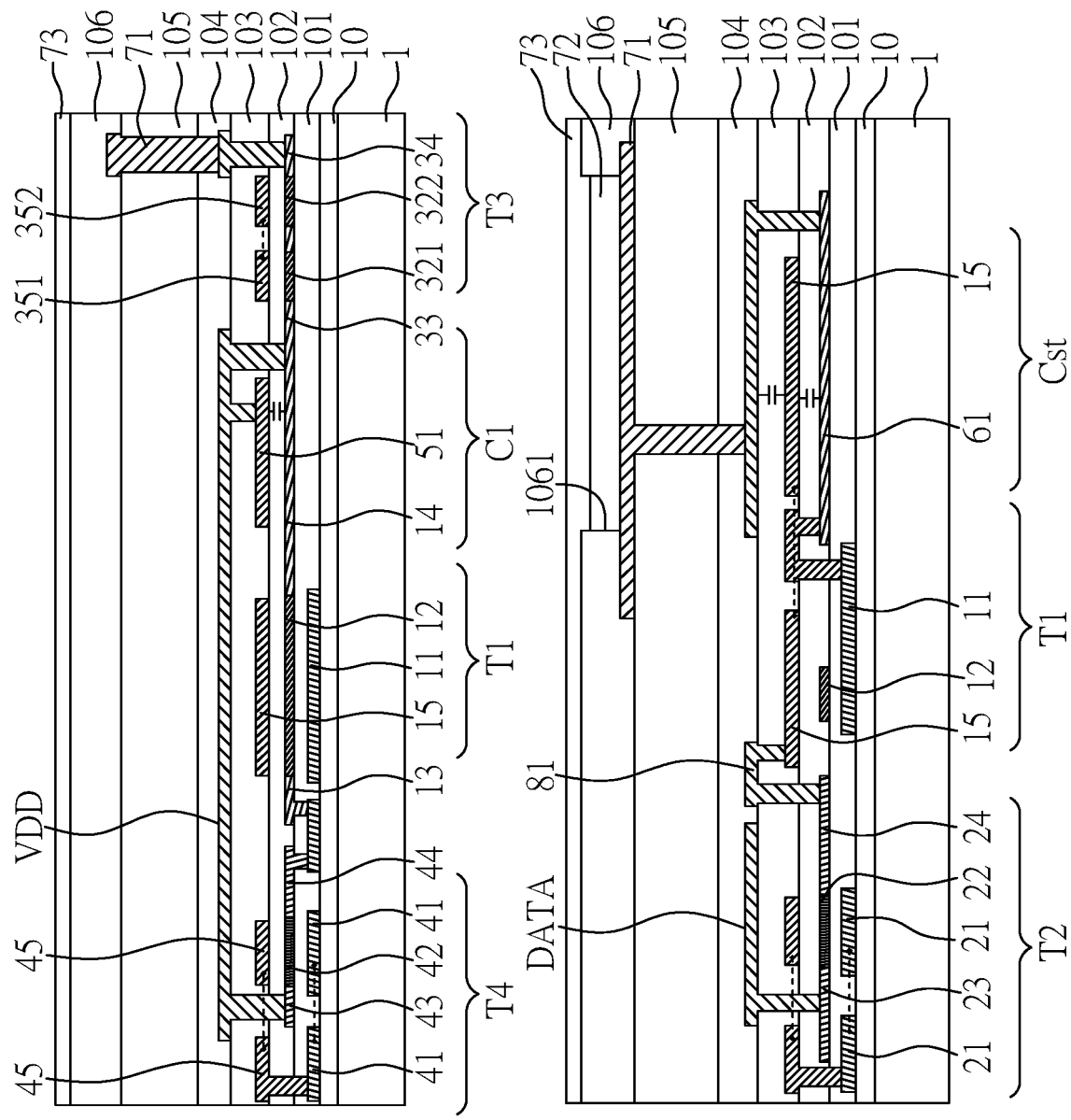
FIG. 6 is a schematic cross sectional view of the display device according to Embodiment 1-3 of the present disclosure.

FIG. 6 is a schematic cross sectional view of the display device of the present embodiment. The preparation process and the structure of the display device of the present embodiment are similar to those of Embodiment 1-1, except for the following differences.

In Embodiment 1-1, the reset thin film transistor T3 is an IGZO TFT. In the present embodiment, the reset thin film transistor T3 is an LTPS TFT. The preparation process and the structure of the reset thin film transistor T3 in the present embodiment are similar to those of the reset thin film transistor T3 in Embodiment 1-2. Hence, the descriptions thereof are not repeated herein.

Embodiment 2

The display device of the present embodiment is similar to that of Embodiment 1. The main difference between the display devices of Embodiment 1 and the present embodiment is that the driving thin film transistor T1 of the present embodiment is an IGZO thin film transistor with a double gate structure.

Figure 7B:
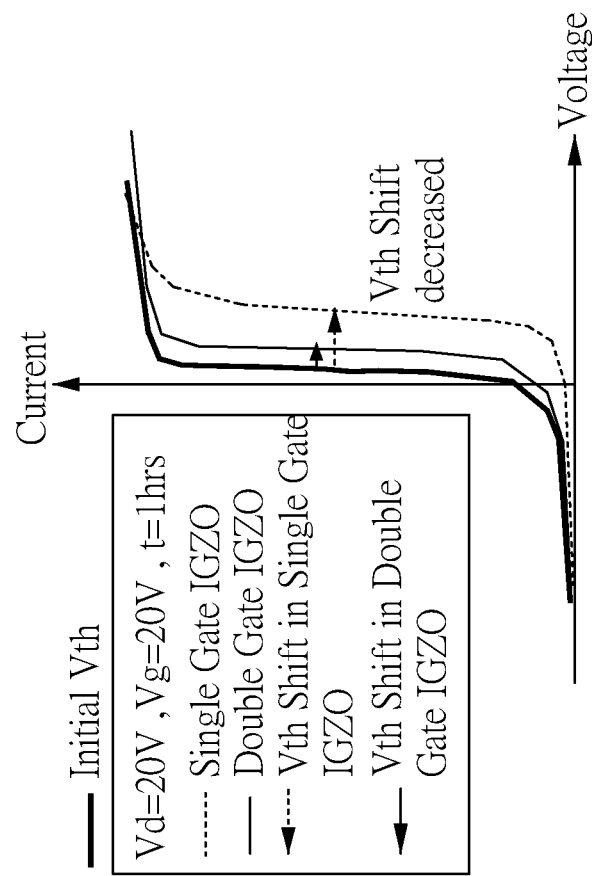
FIG. 7B is a schematic voltage vs. current diagram showing the Vth shift between a single gate IGZO TFT and a double gate IGZO TFT after 1 hour operation.
Figure 7A:
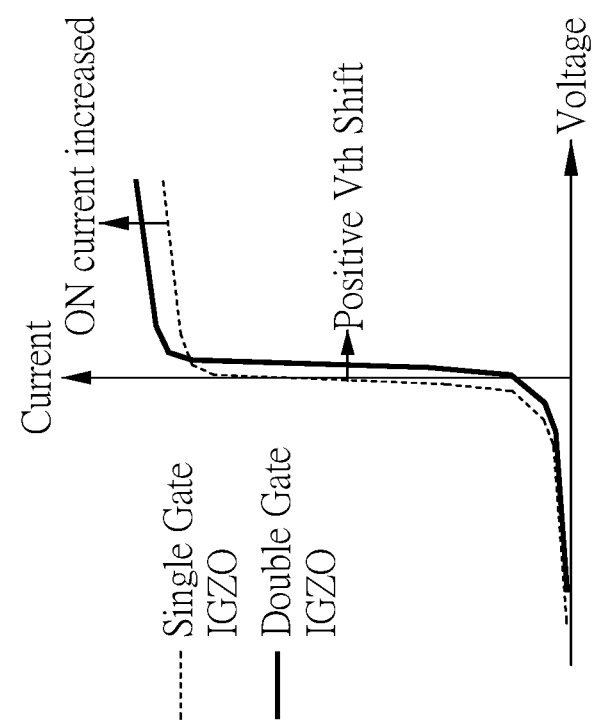
FIG. 7A is a schematic voltage vs. current diagram showing the ON current shift between a single gate IGZO TFT and a double gate IGZO TFT.

FIG. 7A is a schematic voltage vs. current diagram showing the ON current shift between a single gate IGZO TFT and a double gate IGZO TFT. As shown in FIG. 7A, the ON current of the double gate IGZO TFT is larger than that of the single gate IGZO TFT, and positive Vth shift is occurred in the double gate IGZO TFT compared to the single gate IGZO TFT.

FIG. 7B is a schematic voltage vs. current diagram showing the Vth shift between a single gate IGZO TFT and a double gate IGZO TFT after 1 hour operation of voltage of drain electrode at 20 Volts and voltage of gate electrode at 20 Volts. As shown in FIG. 7B, under high current stability test, Vth shift of the double gate IGZO TFT is less than Vth shift of the single gate IGZO TFT. This result indicates that the double gate IGZO TFT has better stability compared to the single gate IGZO TFT.

Hence, when the double gate IGZO TFT is used as the driving thin film transistor T1, the advantages of higher ON current, larger Vth, better high current stability, better threshold voltage uniformity, and/or brightness variations decreased can be achieved. In addition, the bottom gate can also be used as a light shielding layer.

Hereinafter, three aspects of the display devices of Embodiment 2 are exemplified, in which the driving thin film transistor T1 is an IGZO TFT with the double gate structure. However, the present disclosure is not limited thereto.

Embodiment 2-1

Figure 8:
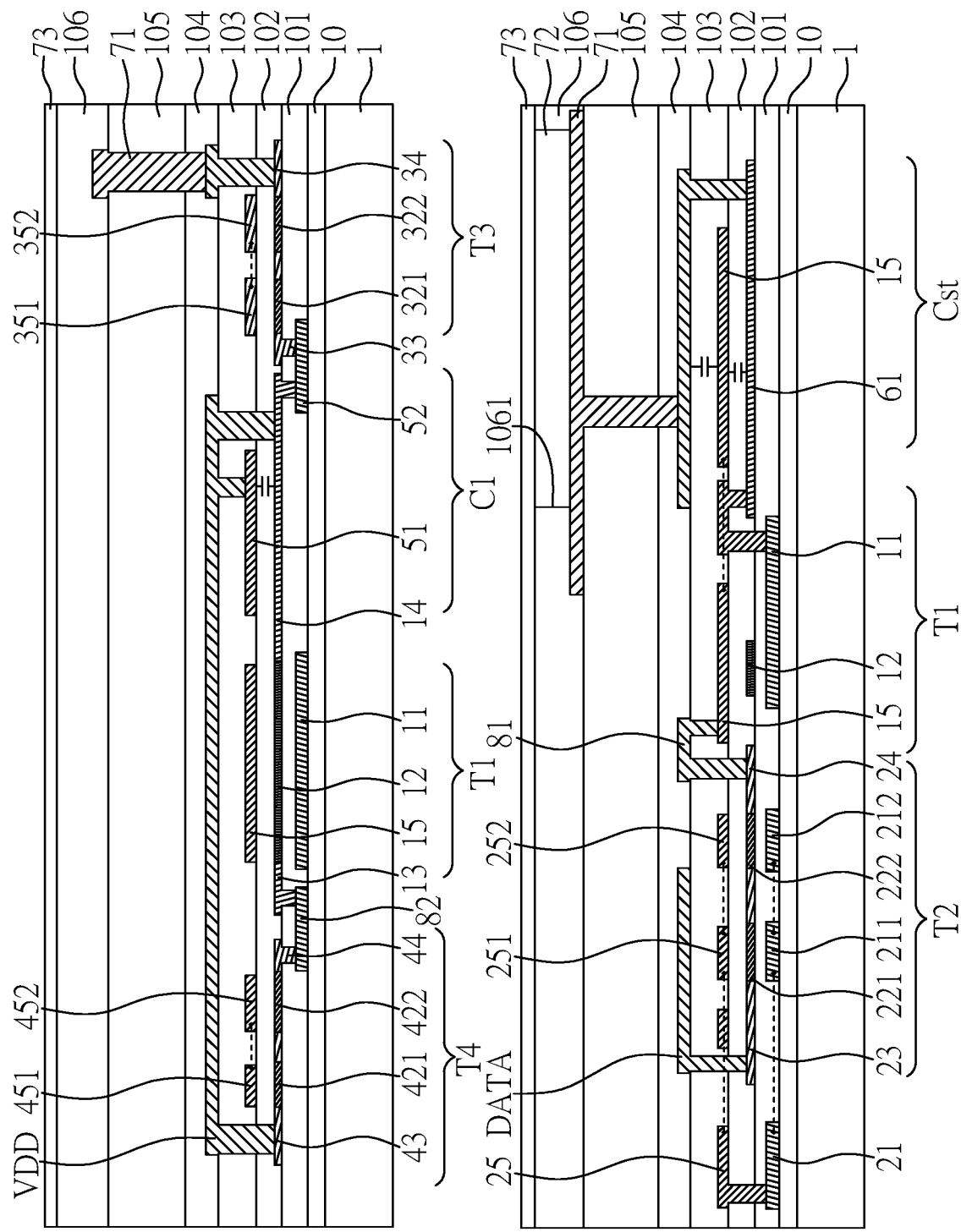
FIG. 8 is a schematic cross sectional view of the display device according to Embodiment 2-1 of the present disclosure.

FIG. 8 is a schematic cross sectional view of the display device of the present embodiment. In the present embodiment, the driving thin film transistor T1 is an IGZO TFT with a double gate structure; the switching thin film transistor T2 is an LTPS TFT with a double gate structure as well as a dual gate structure; the reset thin film transistor T3 is an LTPS TFT with a double gate structure; and the emitting thin film transistor T4 is an LTPS TFT with a dual gate structure. The process and structure of the IGZO TFT of the present embodiment is similar to those illustrated in Embodiment 1, and the process and structure of the LTPS TFT of the present embodiment is also similar to those illustrate in Embodiment 1.

The driving thin film transistor T1 is an IGZO TFT, which comprises: a first semiconductor layer 12; a first top gate electrode 15 disposed above the first semiconductor layer 12; a first bottom gate 11 disposed under the first semiconductor layer 12; a first source electrode 13 electrically connected to the first semiconductor layer 12; a first drain electrode 14 electrically connected to the first semiconductor layer 12, wherein the first drain electrode 14 is electrically connected to the light emitting diode (including the anode 71, the light emitting layer 72 and the cathode 73). Herein, the first semiconductor layer 12, the first source electrode 13 and the first drain electrode 14 comprise an oxide semiconductor layer and are integrated. The first source electrode 13 and the first drain electrode 14 are disposed below the first top gate electrode 15.

When forming the bottom gate and the top gate of the switching thin film transistor T2, two second bottom gate electrodes 211, 212 and two second top gate electrodes 251, 252 are respectively defined. Hence, in the present embodiment the switching thin film transistor T2 has double gate as well as dual gate structures.

The switching thin film transistor T2 is an LTPS TFT, which comprises: two second semiconductor regions 221, 222; two second top gate electrodes 251, 252 disposed above and respectively corresponding to the two second semiconductor regions 221, 222; two second bottom gates 211, 212 disposed under and respectively corresponding to the two second semiconductor regions 221, 222; a second source electrode 23 electrically connected to the second semiconductor region 221; a second drain electrode 24 electrically connected to the second semiconductor region 222. Herein, the second semiconductor regions 221, 222, the second source electrode 23 and the second drain electrode 24 comprise a silicon semiconductor layer and are integrated. The second source electrode 23 and the second drain electrode 24 are disposed below the two second top gate electrodes 251, 252. In addition, the second drain electrode 24 is electrically connected to the first top gate electrode 15 via a metal layer 81.

The reset thin film transistor T3 is an LTPS TFT, which comprises: two third semiconductor regions 321, 322; two third top gate electrodes 351, 352 disposed above and respectively corresponding to the two third semiconductor regions 321, 322; a third source electrode 33 electrically connected to the third semiconductor region 321; and a third drain electrode 34 electrically connected to the third semiconductor region 322. Herein, the third semiconductor regions 321, 322, the third source electrode 33 and the third drain electrode 34 comprise a silicon semiconductor layer and are integrated. The third source electrode 33 and the third drain electrode 34 are disposed below the third top gate electrodes 351, 352.

The emitting thin film transistor T4 is an LTPS TFT, which comprises: two fourth semiconductor regions 421, 422; two fourth top gate electrodes 451, 452 disposed above and respectively corresponding to the two fourth semiconductor regions 421, 422; a fourth source electrode 43 electrically connected to the fourth semiconductor region 421; and a fourth drain electrode 44 electrically connected to the fourth semiconductor region 422. Herein, the fourth semiconductor regions 421, 422, the fourth source electrode 43 and the fourth drain electrode 44 comprise a silicon semiconductor layer and are integrated. The fourth source electrode 43 and the fourth drain electrode 44 are disposed below the fourth top gate electrodes 451, 452. In addition, the fourth drain electrode 44 is electrically connected to the first top gate electrode 15 via a conductive line 82.

The first capacitor C1 comprises a capacitor electrode 51. The first drain electrode 14 is extended as another capacitor electrode of the first capacitor C1, and the capacitor electrode 51 and the first drain electrode 14 partially overlap. In addition, the first capacitor C1 is also electrically connected to the reset thin film transistor T3 through a conductive line 52.

The second capacitor Cst comprises a fifth semiconductor layer 61 as a capacitor electrode, and the fifth semiconductor layer 61 includes an oxide semiconductor layer. In addition, the first top gate electrode 15 is also extended to be another capacitor electrode of the second capacitor Cst, and the fifth semiconductor layer 61 and the first top gate electrode 15 partially overlap.

Embodiment 2-2

Figure 9:
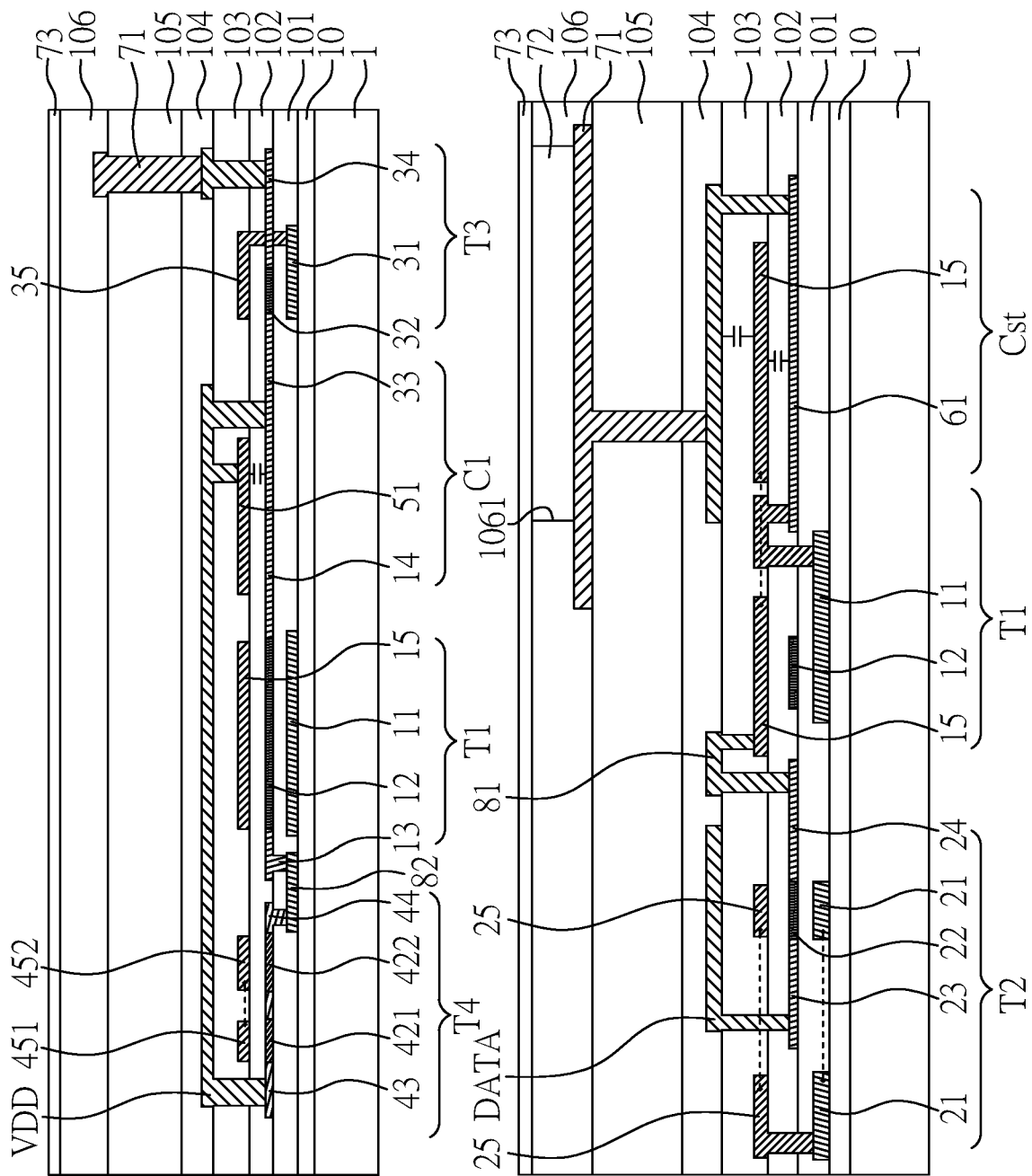
FIG. 9 is a schematic cross sectional view of the display device according to Embodiment 2-2 of the present disclosure.

FIG. 9 is a schematic cross sectional view of the display device of the present embodiment. The preparation process and the structure of the display device of the present embodiment are similar to those of Embodiment 2-1, except for the following differences.

In Embodiment 2-1, the switching thin film transistor T2 and the reset thin film transistor T3 are LTPS TFTs. In the present embodiment, the switching thin film transistor T2 and the reset thin film transistor T3 are IGZO TFTs.

The preparation processes and the structures of the switching thin film transistor T2 and the reset thin film transistor T3 in the present embodiment are similar to those of the switching thin film transistor T2 and the reset thin film transistor T3 in Embodiment 1-1. Hence, the descriptions thereof are not repeated herein.

Embodiment 2-3

Figure 10:
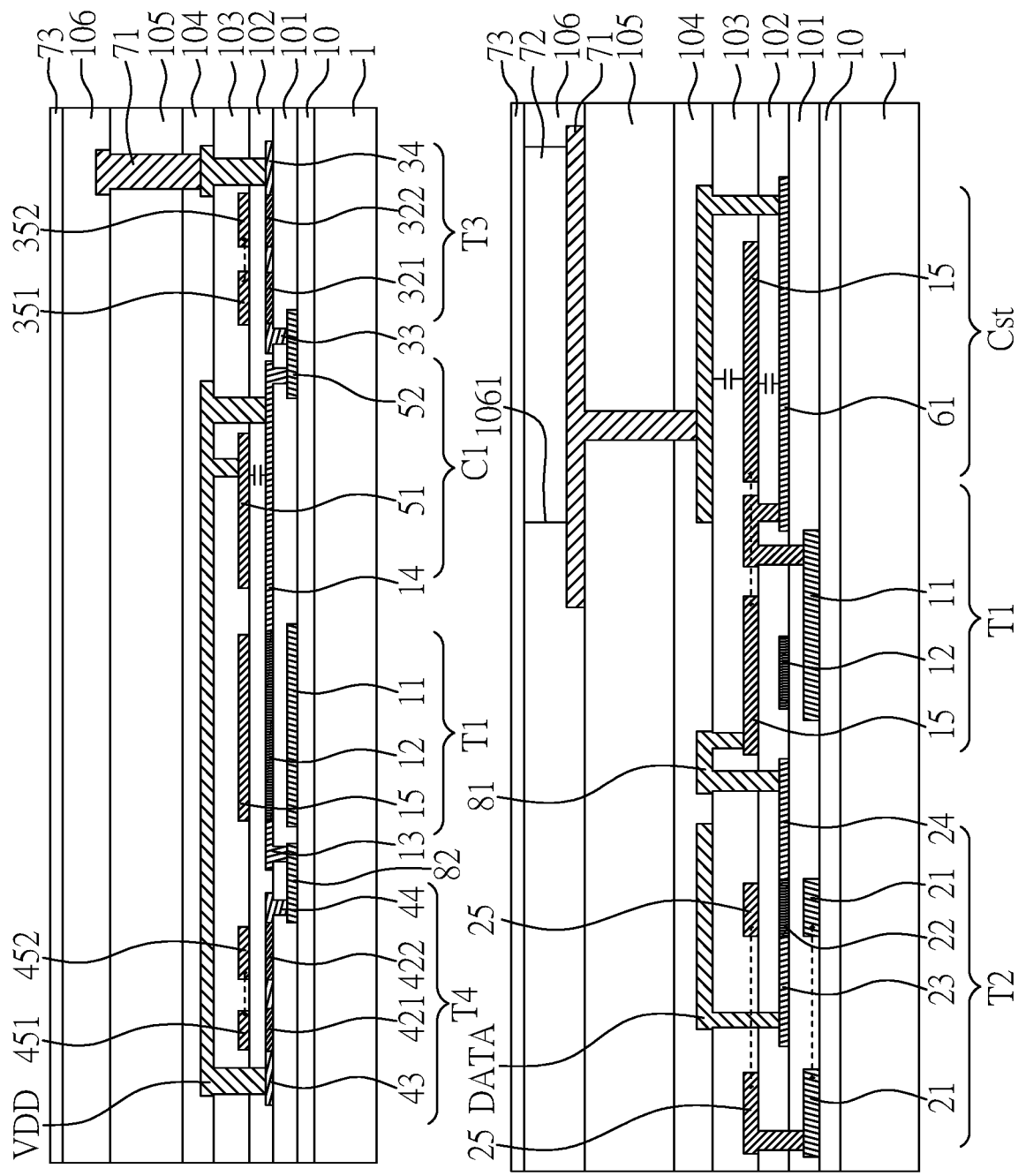
FIG. 10 is a schematic cross sectional view of the display device according to Embodiment 2-3 of the present disclosure.

FIG. 10 is a schematic cross sectional view of the display device of the present embodiment. The preparation process and the structure of the display device of the present embodiment are similar to those of Embodiment 2-1, except for the following differences.

In Embodiment 2-1, the switching thin film transistor T2 is an LTPS TFT. In the present embodiment, the switching thin film transistor T2 is an IGZO TFT. The preparation process and the structure of the switching thin film transistor T2 in the present embodiment are similar to those of the switching thin film transistor T2 in Embodiment 1-1. Hence, the descriptions thereof are not repeated herein.

In the display devices illustrated in the aforesaid embodiments, all the transistors including the driving thin film transistor T1, the switching thin film transistor T2, the reset thin film transistor T3 and the emitting thin film transistor T4 have top gate structures. In addition, the first top gate electrode 15, the second top gate electrode 25, the third top gate electrode 35 and the fourth top gate electrode 45 can be prepared at the same time. Other layers (such as semiconductor layers, bottom gates and so one) in all the transistors can also be prepared simultaneously. Therefore, the manufacturing process of the display device of the present embodiment can be simplified.

Furthermore, for the transistor with silicon semiconductor layer, the advantages of superior control of short channel effects, high Vth, better stability and/or high ON current can be achieved. For the transistor with oxide semiconductor layer, the advantages of higher mobility and/or easy channel passivation can be achieved.

In the display devices illustrated in the aforesaid embodiments, both the driving thin film transistor T1 and the switching thin film transistor T2 have the double gate structures; therefore better pixel circuitry performance can be obtained. The reason why the driving thin film transistor T1 has the double gate structure is illustrated before, and not repeated again. The reason why the switching thin film transistor T2 also has the double gate structure is illustrated hereinafter.

The following Tables 1 to 3 show circuit simulation results, wherein Table 1 shows the result when the switching thin film transistor T2 is the LTPS TFT with the double gate structure or the IGZO TFT with the double gate structure, and Tables 2 and 3 shows the result when the reset thin film transistor T3 is the LTPS TFT with the dual gate or single gate structure or the IGZO TFT with the dual gate or single gate structure. In addition, in the following Tables 1 to 3, the term "VGS" refers to voltage for driving TFT at gate and source electrodes, and the term "VGS peak to peak" refers to voltage difference between each frame.

TABLE 1

Simulation result of the switching thin film transistor T2
1 frame

|  | LTPS | IGZO |
|---|---|---|
| VDATA = 0.3 V | | |
| VGS | 0.248 V | 0.31556 V |
| VGS peak to peak | 108.78 mV | 16.123 mV |
| VDATA = 2 V | | |
| VGS | 1.8275 V | 1.9361 V |
| VGS peak to peak | 87.84 mV | 8.1521 mV |

The result shown in Table 1 indicates that when the switching thin film transistor T2 have the double gate structure, the switching thin film transistor T2 have lower current leakage. Hence, VGS change can be decreased, which means the luminance change can be reduced. Therefore, when the switching thin film transistor T2 has the double gate structure, better pixel circuitry performance can be obtained. In addition, when the switching thin film transistor T2 is the IGZO TFT, better VGS peak to peak stability can also be achieved.

TABLE 2

Simulation result of the reset thin film transistor T3
with the dual gate structure
1 frame

|  | LTPS | IGZO |
|---|---|---|
| VDATA = 0.3 V | | |
| VGS | 0.248 V | 0.24817 V |
| VGS peak to peak | 108.78 mV | 74.993 mV |
| VDATA = 2 V | | |
| VGS | 1.8275 V | 1.831 V |
| VGS peak to peak | 87.84 mV | 83.191 mV |

TABLE 3

Simulation result of the reset thin film transistor T3
with the single gate structure
1 frame

|  | LTPS | IGZO |
|---|---|---|
| VDATA = 0.3 V | | |
| VGS | 0.24985 V | 0.24948 V |
| VGS peak to peak | 74.965 mV | 74.991 mV |
| VDATA = 2 V | | |
| VGS | 1.8291 V | 1.8288 V |
| VGS peak to peak | 88.414 mV | 88.41 mV |

The results shown in Tables 2 and 3 indicate that the VGS change of the reset thin film transistor T3 is not significant no matter the reset thin film transistor T3 has the single gate or dual gate structure.

From the results shown in Tables 1 to 3, it can be concluded that the switching thin film transistor T2 is an important factor for stabilizing brightness variations in the display device.

In the present disclosure, the switching thin film transistor T2 can be the LTPS TFT with the double gate structure. FIG. 11A is a schematic voltage vs. current diagram showing the OFF current shift between a single gate LTPS TFT and a double gate LTPS TFT. It is known that the LTPS TFT has high OFF current, and its OFF current is increased as the intensity of the incident light increased. As shown in FIG. 11, the OFF current of the double gate LTPS TFT is less than that of the single gate LTPS TFT. It is because the bottom gate of the double gate LTPS TFT can block the incident light which may induce higher OFF current leakage of the LTPS TFT. Hence, when the switching thin film transistor T2 is the double gate TFT, the advantage of lower OFF current, smaller VGS change of the driving thin film transistor T1, and/or smaller brightness change can be achieved.

In the present disclosure, the switching thin film transistor T2 can also be the IGZO TFT with the double gate structure. FIG. 11B is a schematic voltage vs. current diagram showing the ON current shift and the Vth shift between a single gate IGZO TFT and a double gate IGZO TFT; and FIG. 11C is a schematic voltage vs. current diagram showing the Vth shift between a single gate IGZO TFT and a double gate IGZO TFT after 5000 sec operation. As shown in FIG. 11B, the ON current of the double gate IGZO TFT is larger than that of the single gate IGZO TFT, and positive Vth shift is occurred in the double gate IGZO TFT compared to the single gate IGZO TFT. As shown in FIG. 11C, after long term operation, Vth shift of the double gate IGZO TFT is less than Vth shift of the single gate IGZO TFT. It is known that the light-induced negative bias stress (LNBS) stability of the IGZO TFT is worse than that of LTPS TFT. In the present disclosure, when the IGZO TFT has the double gate structure, this instability can be decreased. In addition, since the Vth of the switching thin film transistor T2 decides Vref and Vdata, the low OFF current properties and smaller Vth shift is benefit to the precharge, compensation and data writing phase of the 4T2C circuit operation in the display device of the present disclosure.

Alternative Embodiment 1

Figure 12A:
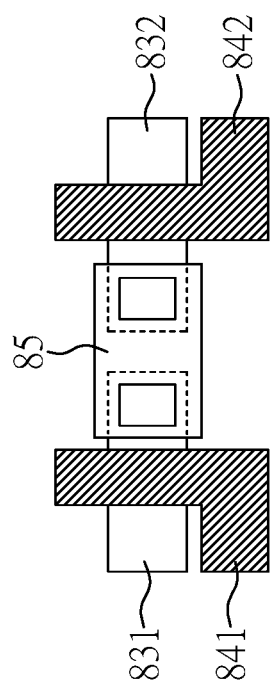
FIGS. 12A to 12C are schematic top views showing the relations between the top gate electrodes and the semiconductor layer in the dual gate structure according to Alternative embodiment 1 of the present disclosure.
Figure 12B:
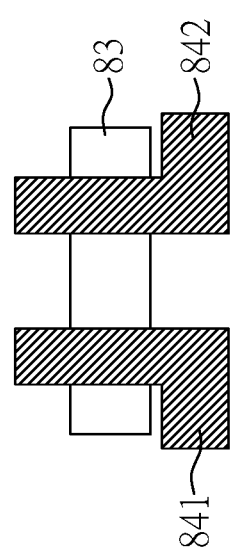
Figure 12C:
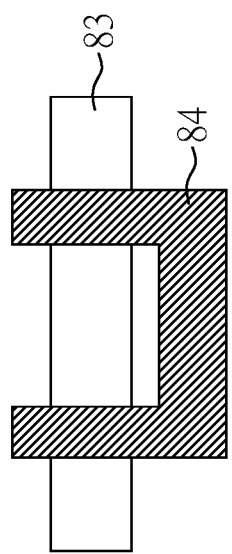

FIGS. 12A to 12C are schematic top views showing the relations between the top gate electrodes and the semiconductor layer in the dual gate structure of the present alternative embodiment.

In one aspect, as shown in FIG. 12A, the thin film transistor with the dual gate structure comprises: two semiconductor regions 831, 832; and two top gate electrodes 841, 842 respectively overlapping the two semiconductor regions 831, 832. Herein, different voltage could be applied to the two top gate electrodes 841, 842. And, the two semiconductor regions 831, 832 can electrically connect to each other by a conductive unit 85. Examples of the material of the conductive unit 85 can include metals, semiconductors, or other conductive materials.

In another aspect, as shown in FIG. 12B, the thin film transistor with the dual gate structure comprises: a semiconductor layer 83; and two top gate electrodes 841, 842 overlapping the semiconductor layer 83. Herein, different voltage could be applied to the two top gate electrodes 841, 842.

In further another aspect, as shown in FIG. 11C, the thin film transistor with the dual gate structure comprises: a semiconductor layer 83; and a gate electrode 84. Herein, two parts of the gate electrode 84 overlaps the semiconductor layer 83, and only one voltage is applied to the gate electrode 84.

In the present alternative embodiment, only the relations between the top gate electrodes and the semiconductor layer are exemplified. In the case that the bottom gate has the dual gate (for example, FIG. 8), the relations between the bottom gate electrodes and the semiconductor layer are similar to those shown in FIGS. 12A to 12C, except that the bottom gate electrodes are disposed below the semiconductor layer.

The structures shown in the present alternative embodiment can be applied to any one of the aforesaid embodiments.

Alternative Embodiment 2

Figure 13:
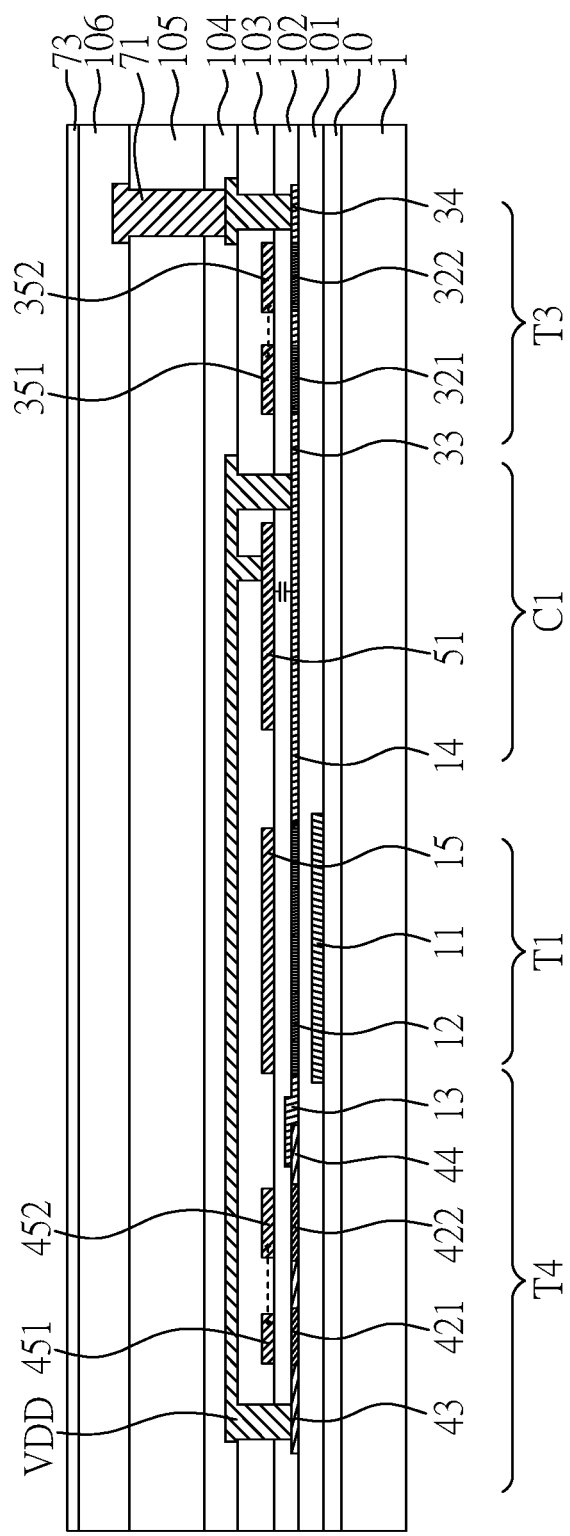
FIG. 13 is a schematic cross sectional view of the display device according to Alternative embodiment 2 of the present disclosure.

FIG. 13 is a schematic cross sectional view of the display device of the present alternative embodiment. In the present alternative embodiment, the reset thin film transistor T3 can have the dual gate structure; and the source or drain electrode of the LTPS TFT can electrically connect to the source or drain electrode of the IGZO TFT by direct contact.

Herein, the display device of Embodiment 2-2 (as shown in FIG. 9) is exemplified in the present alternative embodiment. The structures of the display devices of Embodiment 2-2 and the present alternative embodiment are similar, except the following differences.

In Embodiment 2-2, the reset thin film transistor T3 has the single gate structure. However, in the present alternative embodiment, the reset thin film transistor T3 has the dual gate structure, which comprises: two third semiconductor regions 321, 322; and two top gate electrodes 351, 352 respectively overlapping the two third semiconductor regions 321, 322.

In addition, in Embodiment 2-2, the first source electrode 13 is electrically connected to the fourth drain electrode 44 via the conductive line 82. In the present embodiment, the first source electrode 13 is electrically connected to the fourth drain electrode 44 by direct contact.

The structure shown in the present alternative embodiment can be applied to any one of the aforesaid embodiments.

Alternative Embodiment 3

Figures 14A, 14B:
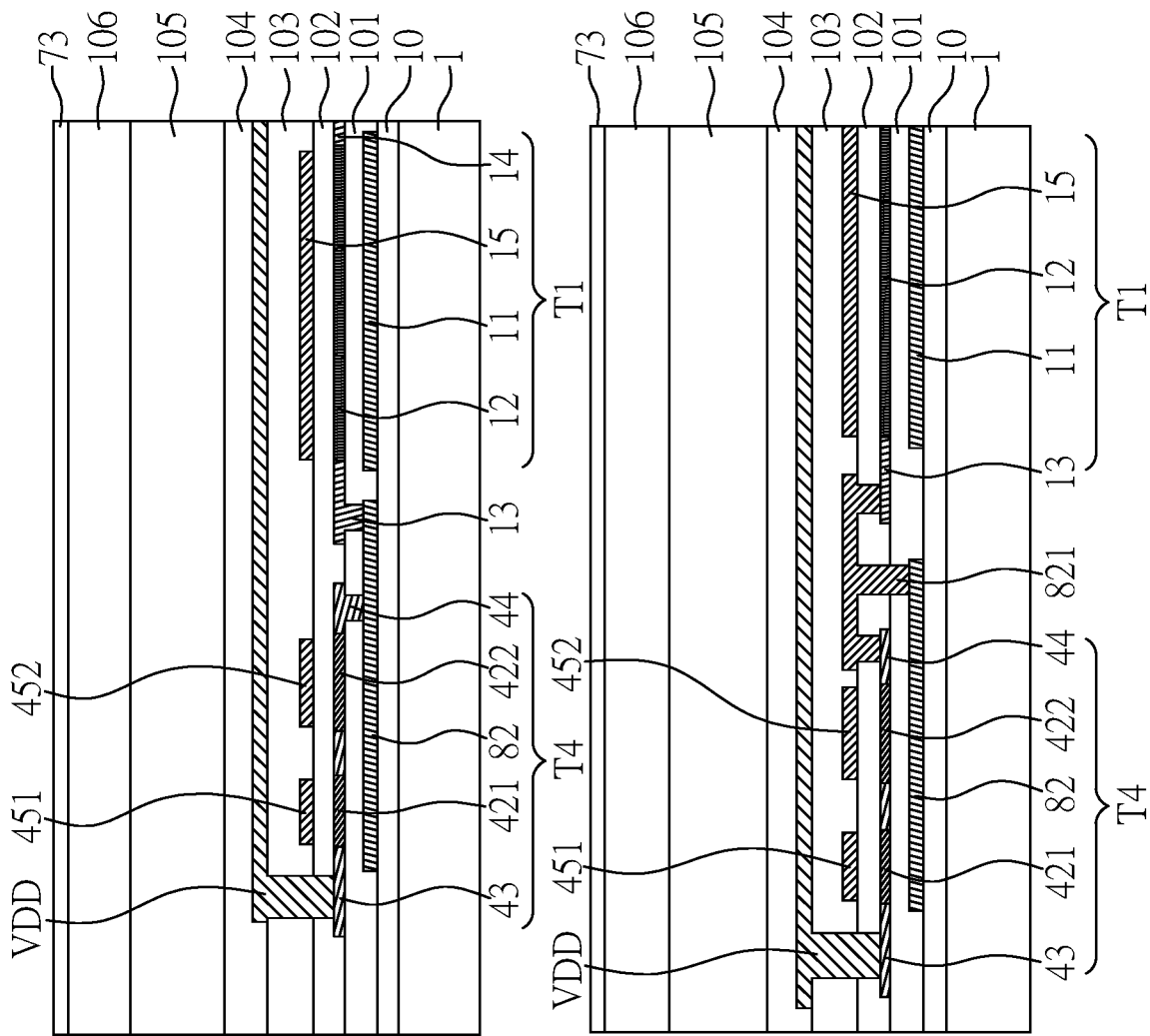
FIGS. 14A and 14B are schematic cross sectional views of the display device according to Alternative embodiment 3 of the present disclosure.

FIGS. 14A and 14B are schematic cross sectional views of the display device of the present alternative embodiment. In the present alternative embodiment, the source or drain electrode of the LTPS TFT can electrically connect to the source or drain electrode of the IGZO TFT by a conductive line; and the conductive line may be extended to overlap the semiconductor layer of the LTPS TFT.

Herein, the display device of Embodiment 2-2 (as shown in FIG. 9) is exemplified in the present alternative embodiment. The structures of the display devices of Embodiment 2-2 and the present alternative embodiment are similar, except the following differences.

In Embodiment 2-2, the conductive line 82 and the fourth semiconductor regions 421, 422 are not overlapped. In the aspect shown in FIG. 14A, the conductive layer 82 is extended and overlaps the fourth semiconductor regions 421, 422. Therefore, the extended conductive layer 82 can be used as a shielding layer for the LTPS TFT.

In the aspect shown in FIG. 14B, the fourth drain electrode 44 is electrically connected to the first source electrode 13 via the conductive line 82 and further via a metal trace 821.

The structure shown in the present alternative embodiment can be applied to any one of the aforesaid embodiments.

Alternative Embodiment 4

Figure 15:
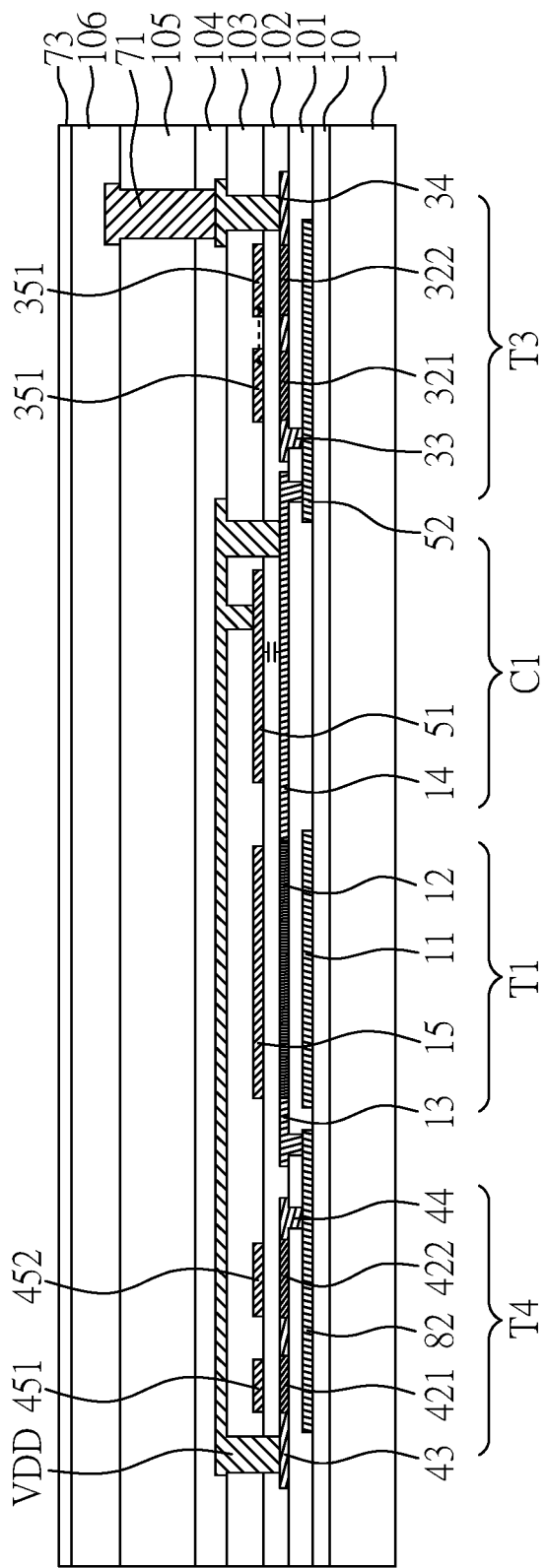
FIG. 15 is a schematic cross sectional view of the display device according to Alternative embodiment 3 of the present disclosure.

FIG. 15 is a schematic cross sectional view of the display device of the present alternative embodiment. In the present alternative embodiment, the conductive line may be extended to overlap the semiconductor layer of the LTPS TFT Herein, the display devices of Embodiment 2-3 (as shown in FIG. 10) are exemplified in the present alternative embodiment. The structures of the display devices of Embodiment 2-3 and the present alternative embodiment are similar, except the following differences.

In Embodiment 2-3, the conductive line 82 and the fourth semiconductor regions 421, 422 are not overlapped, and the conductive line 52 and the third semiconductor regions 321, 322 are not overlapped. In the aspect shown in FIG. 15, the conductive layers 52, 82 are extended and respectively overlap the fourth semiconductor regions 421, 422 and the third semiconductor regions 321, 322. Therefore, the extended conductive layers 52, 82 can be used as shielding layers for the LTPS TFTs.

The structure shown in the present alternative embodiment can be applied to any one of the aforesaid embodiments.

In addition, a display device made as described in any of the embodiments of the present disclosure as described previously may be integrated with a touch panel to form a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
   a substrate;
   a light emitting diode disposed above the substrate;
   a first transistor disposed above the substrate and comprising:
   a first semiconductor layer;
   a first top gate electrode disposed above the first semiconductor layer;

a first bottom gate electrode disposed under the first semiconductor layer;

a first source electrode electrically connected to the first semiconductor layer; and a first drain electrode electrically connected to the first semiconductor layer, wherein the first drain electrode is electrically connected to the light emitting diode; and a second transistor disposed above the substrate and comprising a second semiconductor layer and a second drain electrode electrically connected to the second semiconductor layer, wherein the second drain electrode is electrically connected to the first top gate electrode;

wherein the first semiconductor layer comprises a first silicon semiconductor layer, and the second semiconductor layer comprises a first oxide semiconductor layer.

2. The display device of claim 1, wherein the first source electrode and the first drain electrode are disposed below the first top gate electrode.

3. The display device of claim 1, wherein the second transistor further comprises a first gate electrode and a second gate electrode, and the first gate electrode and the second gate electrode are disposed above the second semiconductor layer.

4. The display device of claim 3, wherein the second semiconductor layer comprises two second semiconductor regions, and the two second semiconductor regions respectively overlap the first gate electrode and the second gate electrode.

5. The display device of claim 3, wherein the second transistor further comprises a seventh gate electrode, and the seventh gate electrode is disposed under the second semiconductor layer.

6. The display device of claim 1, wherein the first source electrode, the first drain electrode and the first semiconductor layer are integrated.

7. The display device of claim 1, further comprising a third transistor which is disposed above the substrate, wherein the third transistor comprises a third semiconductor layer, a third gate electrode and a fourth gate electrode, and the third gate electrode and the fourth gate electrode are disposed above the third semiconductor layer.

8. The display device of claim 7, wherein the third semiconductor layer comprises a second silicon semiconductor layer or a second oxide semiconductor layer.

9. The display device of claim 1, further comprising a fourth transistor which is disposed above the substrate, wherein the fourth transistor comprises a fourth semiconductor layer, a fifth gate electrode and a sixth gate electrode, the fifth gate electrode is disposed above the fourth semiconductor layer, and the sixth gate electrode is disposed under the fourth semiconductor layer.

10. The display device of claim 9, wherein the fourth semiconductor layer comprises a third oxide semiconductor layer or a third silicon semiconductor layer.

11. The display device of claim 1, further comprising a first capacitor, wherein the first capacitor comprises a capacitor electrode, and the capacitor electrode and the first drain electrode partially overlap.

12. The display device of claim 1, further comprising a second capacitor, wherein the second capacitor comprises a fifth semiconductor layer, and the fifth semiconductor layer and the first top gate electrode partially overlap.

13. A display device, comprising:

a substrate;

a light emitting diode disposed above the substrate;

a first transistor disposed above the substrate and comprising:

a first semiconductor layer;

a first top gate electrode disposed above the first semiconductor layer;

a first bottom gate electrode disposed under the first semiconductor layer;

a first source electrode electrically connected to the first semiconductor layer; and a first drain electrode electrically connected to the first semiconductor layer, wherein the first drain electrode is electrically connected to the light emitting diode; and a second transistor disposed above the substrate and comprising a second semiconductor layer, a first gate electrode and a second gate electrode, wherein the first gate electrode and the second gate electrode are disposed above the second semiconductor layer;

wherein the first semiconductor layer comprises a first silicon semiconductor layer, and the second semiconductor layer comprises a first oxide semiconductor layer.

* * * * *